United States Patent
Guo et al.

(10) Patent No.: US 8,865,013 B2
(45) Date of Patent: Oct. 21, 2014

(54) METHOD FOR CHEMICAL MECHANICAL POLISHING TUNGSTEN

(75) Inventors: Yi Guo, Newark, DE (US); Jerry Lee, Newark, DE (US); Raymond L. Lavoie, Jr., Millsboro, DE (US); Guangyun Zhang, Furlong, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 1 day.

(21) Appl. No.: 13/209,749

(22) Filed: Aug. 15, 2011

(65) Prior Publication Data
US 2013/0045598 A1    Feb. 21, 2013

(51) Int. Cl.
| | |
|---|---|
| *H01L 21/302* | (2006.01) |
| *C09G 1/02* | (2006.01) |
| *C09K 13/00* | (2006.01) |
| *H01L 21/768* | (2006.01) |
| *H01L 21/321* | (2006.01) |
| *C09K 3/14* | (2006.01) |
| *H01L 21/3105* | (2006.01) |

(52) U.S. Cl.
CPC .............. *C09G 1/02* (2013.01); *H01L 21/7684* (2013.01); *H01L 21/3212* (2013.01); *H01L 21/31053* (2013.01); *C09K 3/1463* (2013.01)
USPC .............. 216/88; 216/89; 216/100; 216/108; 438/626; 438/633; 438/645; 438/648; 438/692; 438/693; 438/754; 252/79.1; 252/79.2

(58) Field of Classification Search
None
See application file for complete search history.

(56) References Cited

U.S. PATENT DOCUMENTS

| | | | |
|---|---|---|---|
| 6,136,711 A | | 10/2000 | Grumbine et al. |
| 6,527,819 B2 | | 3/2003 | Wojtczak et al. |
| 6,569,770 B2 | | 5/2003 | Wang et al. |
| 6,641,630 B1 | * | 11/2003 | Sun .................................. 51/307 |
| 6,774,041 B1 | | 8/2004 | Kondo et al. |
| 8,025,813 B2 | * | 9/2011 | Liu et al. ...................... 252/79.1 |
| 8,119,529 B2 | * | 2/2012 | Guo et al. ...................... 438/693 |
| 8,232,208 B2 | * | 7/2012 | Guo et al. ...................... 438/689 |
| 2005/0108949 A1 | * | 5/2005 | Matsuda et al. ................. 51/308 |
| 2007/0101659 A1 | * | 5/2007 | Choung et al. .................. 51/307 |
| 2008/0020680 A1 | | 1/2008 | Vacassy et al. |
| 2008/0203354 A1 | | 8/2008 | Kamimura et al. |
| 2009/0311864 A1 | * | 12/2009 | Yamada et al. ................ 438/693 |
| 2010/0159698 A1 | | 6/2010 | McConnell et al. |
| 2012/0070989 A1 | * | 3/2012 | Liu et al. ....................... 438/693 |

FOREIGN PATENT DOCUMENTS

| | | |
|---|---|---|
| WO | 03068881 | 8/2003 |
| WO | 2004037937 | 5/2004 |

* cited by examiner

*Primary Examiner* — Anita Alanko
(74) *Attorney, Agent, or Firm* — Thomas S. Deibert

(57) ABSTRACT

A method for chemical mechanical polishing of a substrate comprising tungsten using a nonselective chemical mechanical polishing composition.

16 Claims, No Drawings

METHOD FOR CHEMICAL MECHANICAL POLISHING TUNGSTEN

The present invention relates to a method for chemical mechanical polishing of a substrate comprising tungsten. More particularly, the present invention relates to a method for chemical mechanical polishing of a semiconductor substrate comprising tungsten vias.

Tungsten is widely used in semiconductor manufacturing for the formation of contact vias and holes connecting inter layer metal lines in integrated circuit fabrications. Typically, via holes are etched through an interlevel dielectric (ILD) to interconnection lines or to a semiconductor substrate. A thin adhesion layer of, for example, titanium nitride or titanium may then be formed over the ILD and into the etched via hole. A tungsten film is then blanket deposited over the adhesion layer and into the via. Excess tungsten is then removed by chemical mechanical polishing (CMP) to form the tungsten vias.

The chemical mechanical polishing composition used in the CMP is an important variable in determining the success of the CMP. Depending on the choice of the abrasive and other additives, the chemical mechanical polishing composition can be tailored to provide effective polishing of various layers present at desired polishing rates while minimizing surface imperfections, defects, corrosion, and erosion of the interlevel dielectric adjacent to the tungsten vias. Furthermore, the chemical mechanical polishing composition may be used to provide controlled polishing selectivity to other materials present at the surface of the substrate being polished such as, for example, titanium, titanium nitride, silicon nitride and the like.

Typically, the tungsten CMP process is accomplished using a chemical mechanical polishing composition that includes abrasive particles and a chemical reagent. Conventional polishing compositions for tungsten CMP use alumina ($Al_2O_3$) or silica ($SiO_2$) fine particles as an abrasive material in a harsh oxidizing environment. The choice of the oxidizing agent depends on the overall formulation of the polishing composition and the specific requirements of the tungsten CMP integration process. The polishing compositions used are increasingly being formulated with ingredients that are designed to etch tungsten in an effort to enhance the tungsten removal rate exhibited by the composition. In many cases, however, the resulting composition etch tungsten in a manner that chemically etches tungsten from the surface instead of converting the tungsten to a soft oxidized film that is more easily removed from the surface by mechanical abrasion. Due to this enhanced chemical action, such compositions tend to cause recessing of the tungsten plug. Recessed tungsten vias, where the surface of the tungsten in the via is below that of the surrounding interlayer dielectric material can cause electrical contact problems to other areas of the device. Moreover, the recessing in the center of the tungsten vias can lead to increased nonplanarity of the device on subsequent levels of the device. Etching of the tungsten from the center of the vias can also cause undesirable "keyholing".

One asserted solution for improving the tungsten via formation is disclosed by Grumbine, et al. in U.S. Pat. No. 6,136,711. Grumbine, et al. disclose a chemical mechanical polishing composition comprising: a compound that is capable of etching tungsten; and at least one inhibitor of tungsten etching, wherein the inhibitor of tungsten etching is a compound that includes a nitrogen containing functional group selected from compounds having three or more carbon atoms that form alkylammonium ions, amino alkyls having three or more carbon atoms, amino acids other than sulfur containing amino acids and mixtures thereof.

Use of an oxide buff step following the tungsten polish step provides an alternative means to achieve better tungsten via topography. Such oxide buff steps are becoming increasingly important as the contact size on semiconductor substrates continues to shrink.

Accordingly, there is a continuing need for new chemical mechanical polishing compositions and methods for use as tungsten buff formulations for achieving better topography performance.

The present invention provides a method for chemical mechanical polishing of a substrate, comprising: providing a substrate, wherein the substrate comprises tungsten; providing a chemical mechanical polishing slurry composition comprising (consisting essentially of), as initial components: water; 0.1 to 5 wt % of an abrasive; 0.005 to 0.1 wt % of a diquaternary compound according to formula (I):

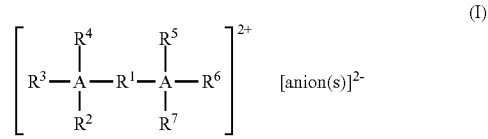

wherein each A is independently selected from N and P; wherein $R^1$ is selected from a saturated or unsaturated $C_1$-$C_{15}$ alkyl group, a $C_6$-$C_{15}$ aryl group and a $C_6$-$C_{15}$ aralkyl group; wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group; and, wherein the anion in formula (I) can be any anion or combination of anions that balance the 2+ charge on the cation in formula (I); 0.001 to 10 wt % of at least one of a phthalic acid, a phthalic anhydride, a phthalate compound and a phthalic acid derivative; and, 0.001 to 10 wt % potassium iodate; wherein the chemical mechanical polishing composition provided has a pH of 1 to 4; wherein the chemical mechanical polishing composition exhibits a tungsten static etch rate of ≤5 Å/min and a tungsten removal rate of ≥100 Å/min; wherein the chemical mechanical polishing composition contains <0.001 wt % per-oxy oxidizer; and, wherein the chemical mechanical polishing composition contains <0.005 wt % corrosion inhibitor agent; providing a chemical mechanical polishing pad with a polishing surface; creating dynamic contact at an interface between the polishing surface of the chemical mechanical polishing pad and the substrate with a down force of 0.69 to 34.5 kPa; and dispensing the chemical mechanical polishing slurry composition onto the chemical mechanical polishing pad at or near the interface between the chemical mechanical polishing pad and the substrate; wherein the substrate is polished; and, wherein some of the tungsten is removed from the substrate.

The present invention also provides a method for chemical mechanical polishing of a substrate, comprising: providing a substrate, wherein the substrate comprises tungsten; providing a chemical mechanical polishing slurry composition comprising (consisting essentially of), as initial components: water; 1.5 to 3.5 wt % of the abrasive, wherein the abrasive is a colloidal silica abrasive having an average particle size of 10 to 100 nm; 0.01 to 0.1 wt % of the diquaternary compound; wherein each A is a N; wherein $R^1$ is a —$(CH_2)_4$— group; wherein $R^2$, $R^3$, $R^4$, $R^5$, $R^6$ and $R^7$ are each a —$(CH_2)_3CH_3$ group; 0.01 to 1 wt % of ammonium hydrogen phthalate; and, 0.01 to 1 wt % potassium iodate; and, wherein the chemical mechanical polishing composition provided has a pH of 2 to 3; wherein the chemical mechanical polishing composition exhibits a tungsten static etch rate of ≤5 Å/min and a tungsten removal rate of ≥100 Å/min; wherein the chemical mechanical polishing composition contains <0.001 wt % per-oxy oxidizer; and, wherein the chemical mechanical polishing composition contains <0.005 wt % corrosion inhibitor agent; providing a chemical mechanical polishing pad with a polishing surface; creating dynamic contact at an interface between the polishing surface of the chemical mechanical polishing pad and the substrate with a down force of 0.69 to 34.5 kPa; and dispensing the chemical mechanical polishing slurry composition onto the chemical mechanical polishing pad at or near the interface between the chemical mechanical polishing pad and the substrate; wherein the substrate is polished; and, wherein some of the tungsten is removed from the substrate.

The present invention also provides a method for chemical mechanical polishing of a substrate, comprising: providing a substrate, wherein the substrate comprises tungsten; providing a chemical mechanical polishing slurry composition comprising (consisting essentially of), as initial components: water; 1.5 to 3.5 wt % of the abrasive, wherein the abrasive is a colloidal silica abrasive having an average particle size of 25 to 75 nm; 0.01 to 0.03 wt % of the diquaternary compound according to formula (I); wherein each A is a N; wherein $R^1$ is a —$(CH_2)_4$— group; wherein $R^2$, $R^3$, $R^4$, $R^5$, $R^6$ and $R^7$ are each a —$(CH_2)_3CH_3$ group; 0.05 to 0.5 wt % of ammonium hydrogen phthalate; and, 0.1 to 0.5 wt % potassium iodate; wherein the chemical mechanical polishing composition provided has a pH of 2 to 3; wherein the chemical mechanical polishing composition exhibits a tungsten static etch rate of ≤5 Å/min and a tungsten removal rate of ≥100 Å/min; wherein the chemical mechanical polishing composition contains <0.001 wt % per-oxy oxidizer; and, wherein the chemical mechanical polishing composition contains <0.005 wt % corrosion inhibitor agent; providing a chemical mechanical polishing pad with a polishing surface; creating dynamic contact at an interface between the polishing surface of the chemical mechanical polishing pad and the substrate with a down force of 0.69 to 34.5 kPa; and dispensing the chemical mechanical polishing slurry composition onto the chemical mechanical polishing pad at or near the interface between the chemical mechanical polishing pad and the substrate; wherein the substrate is polished; wherein some of the tungsten is removed from the substrate; wherein the chemical mechanical polishing composition facilitates a tungsten removal rate of ≥300 Å/min with a platen speed of 133 revolutions per minute, a carrier speed of 111 revolutions per minute, a chemical mechanical polishing composition flow rate of 200 ml/min, and a nominal down force of 13.8 kPa on a 200 mm polishing machine using a chemical mechanical polishing pad that comprises a polyurethane impregnated nonwoven polishing pad; and wherein the substrate further comprises $Si_3N_4$; wherein at least some of the $Si_3N_4$ is removed from the substrate; and, wherein the chemical mechanical polishing composition exhibits a tungsten removal rate to $Si_3N_4$ removal rate selectivity of 2:1 to 1:2 with a platen speed of 133 revolutions per minute, a carrier speed of 111 revolutions per minute, a chemical mechanical polishing composition flow rate of 200 ml/min, and a nominal down force of 13.8 kPa on a 200 mm polishing machine using a chemical mechanical polishing pad that comprises a polyurethane impregnated nonwoven polishing pad.

DETAILED DESCRIPTION

The method for chemical mechanical polishing of the present invention is useful for polishing a substrate comprising tungsten, particularly semiconductor wafers comprising tungsten vias. The chemical mechanical polishing composition used in the method of the present invention desirably exhibits a low tungsten static etch rate (≤5 Å/min) in a non-selective tailorable formulation.

The method for chemical mechanical polishing of a substrate of the present invention is useful for chemical mechanical polishing of a substrate comprising tungsten. The method for chemical mechanical polishing of a substrate of the present invention is particularly useful for chemical mechanical polishing of a semiconductor wafer having tungsten vias.

Preferably, the substrate polished using the method of the present invention optionally further comprises an additional material selected from phosphor silicate glass (PSG), borophosphor silicate glass (BPSG), undoped silicate glass (USG), spin-on-glass (SOG), tetraethyl orthosilicate (TEOS), plasma-enhanced TEOS (PETEOS), flowable oxide (FOx), high-density plasma chemical vapor deposition (HDP-CVD) oxide, and silicon nitride ($Si_3N_4$). Preferably, the substrate polished using the method of the present invention further comprises an additional material selected from TEOS and $Si_3N_4$.

Preferably, the water used as an initial component in the chemical mechanical polishing composition used in the method for chemical mechanical polishing of the present invention is at least one of deionized and distilled to limit incidental impurities.

Abrasives suitable for use in the chemical mechanical polishing composition used in the method for chemical mechanical polishing of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive used is a colloidal silica abrasive. More preferably, the abrasive used is a colloidal silica having an average particle size of 1 to 100 nm (more preferably 10 to 100 nm, most preferably 25 to 75 nm) as determined by well known laser light scattering techniques.

The chemical mechanical polishing composition used in the method for chemical mechanical polishing of the present invention preferably comprises, as an initial component, 0.1 to 5 wt % (more preferably 1.5 to 3.5 wt %) abrasive. Preferably, the abrasive is a colloidal silica abrasive. Most preferably, the chemical mechanical polishing composition of the present invention comprises, as an initial component, 0.1 to 5 wt % (more preferably 1.5 to 3.5 wt %) of a colloidal silica abrasive having an average particle size of 1 to 100 nm (more preferably 10 to 100 nm, most preferably 25 to 75 nm).

The chemical mechanical polishing composition used in the method for chemical mechanical polishing of the present invention preferably comprises, as an initial component, a diquaternary substance according to formula (I):

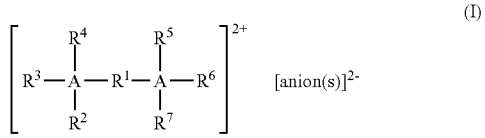

$$\left[ \begin{array}{c} R^4 \quad\quad R^5 \\ | \quad\quad\quad | \\ R^3 - A - R^1 - A - R^6 \\ | \quad\quad\quad | \\ R^2 \quad\quad R^7 \end{array} \right]^{2+} [anion(s)]^{2-} \quad\quad (I)$$

wherein each A is independently selected from N and P, preferably each A is N; wherein $R^1$ is selected from a saturated or unsaturated $C_1$-$C_{15}$ alkyl group, a $C_6$-$C_{15}$ aryl group and a $C_6$-$C_{15}$ aralkyl group (preferably a $C_2$-$C_{10}$ alkyl group; more preferably a $C_2$-$C_6$ alkyl group; still more preferably a —$(CH_2)_6$— group and a —$(CH_2)_4$— group; most preferably a —$(CH_2)_4$— group); wherein $R^2$, $R^3$, $R^4$, $R^5$, $R^6$ and $R^7$ are each independently selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group (preferably a hydrogen and a $C_1$-$C_6$ alkyl group; more preferably a hydrogen and a butyl group; most preferably a butyl group); and, wherein the anion in formula (I) can be any anion or combination of anions that balance the 2+ charge on the cation in formula (I) (preferably the anion(s) in formula (I) is(are) selected from halide anions, hydroxide anions, nitrate anions, sulfate anions and phosphate anions; more preferably halide anions and hydroxide anions; most preferably hydroxide anions). Preferably, the chemical mechanical polishing composition used comprises, as an initial component, 0.005 to 0.1 wt % (more preferably 0.01 to 0.1 wt %, most preferably 0.01 to 0.03 wt %) of a diquaternary substance according to formula (I). Most preferably, the chemical mechanical polishing composition used comprises, as an initial component, 0.005 to 0.1 wt % (more preferably 0.01 to 0.1 wt %, most preferably 0.01 to 0.03 wt %) of a diquaternary substance according to formula (I), wherein each A is N; $R^1$ is a —$(CH_2)_4$— group; and, wherein $R^2$, $R^3$, $R^4$, $R^5$, $R^6$ and $R^7$ are each a —$(CH_2)_3CH_3$ group. Inclusion of the optional diquaternary substance according to formula (I) in the chemical mechanical polishing slurry composition of the present invention provides (under the polishing conditions set forth in the Examples) an increased silicon oxide removal rate, a decreased $Si_3N_4$ removal rate and a slightly enhanced tungsten removal rate.

The chemical mechanical polishing composition used in the method for chemical mechanical polishing of the present invention preferably comprises, as an initial component, 0.001 to 10 wt % (more preferably 0.01 to 1 wt %, most preferably 0.05 to 0.5 wt %) of at least one of a phthalic acid, a phthalic anhydride, a phthalate compound and a phthalic acid derivative. Preferably, phthalic acid is incorporated into the chemical mechanical polishing composition used through the addition of a phthalate compound such as for example, hydrogen potassium phthalate; or through the addition of a phthalic acid derivative such as, for example, ammonium hydrogen phthalate. Most preferably, the chemical mechanical polishing composition used comprises, as an initial component, 0.001 to 10 wt % (more preferably 0.01 to 1 wt %, most preferably 0.05 to 0.5 wt %) of ammonium hydrogen phthalate.

The chemical mechanical polishing composition used in the method for chemical mechanical polishing of the present invention preferably comprises, as an initial component, 0.001 to 10 wt % (more preferably 0.01 to 1 wt %, most preferably 0.1 to 0.5 wt %) potassium iodate.

The chemical mechanical polishing composition used in the method for chemical mechanical polishing of the present invention preferably has a pH of 1 to 4 (more preferably 2 to 3). Acids suitable for adjusting the pH of the chemical mechanical polishing composition include, for example, nitric acid, sulfuric acid and hydrochloric acid. Bases suitable for adjusting the pH of the chemical mechanical polishing composition include, for example, ammonium hydroxide, potassium hydroxide, tetramethylammonium hydroxide and bicarbonate; preferably tetramethylammonium hydroxide.

The chemical mechanical polishing composition used in the chemical mechanical polishing method of the present invention optionally further comprises additional additives selected from defoaming agents, dispersants, surfactants and buffers.

The chemical mechanical polishing composition used in the method for chemical mechanical polishing of the present invention is per-oxy oxidizer free. The term "per-oxy oxidizer" as used herein and in the appended claims means oxidizers selected from hydrogen peroxide, urea hydrogen peroxide, percarbonate salts, benzoyl peroxide, peracetic acid, sodium peroxide, di-tert-butyl peroxide, monopersulfate salts, dipersulfate salts, iron(III) compounds. The term "per-oxy oxidizer free" as used herein and in the appended claims means that the chemical mechanical polishing composition contains <0.001 wt % per-oxy oxidizer. Preferably, the chemical mechanical polishing composition contains <0.0005 wt % (more preferably <0.0001 wt %) per-oxy oxidizer.

The chemical mechanical polishing composition used in the method for chemical mechanical polishing of the present invention is corrosion inhibitor agent free. The term "corrosion inhibitor agent" as used herein and in the appended claims is a component that functions to inhibit the corrosion of tungsten by adsorbing to the surface to be polishing and forming a film thereon. Corrosion inhibitor agents, for example: benzotriazole; 1,2,3-benzotriazole; 5,6-dimethyl-1,2,3-benzotriazole; 1-(1,2-dicarboxyethyl)benzotriazole; 1-[N,N-bis(hydroxylethyl)aminomethyl]benzotrizole; or 1-(hydroxylmethyl)benzotriazole. The term "corrosion inhibitor agent free" as used herein and in the appended claims means that the chemical mechanical polishing composition contains <0.005 wt % corrosion inhibitor agent. Preferably, the chemical mechanical polishing composition contains <0.001 wt % (more preferably <0.0001 wt %) corrosion inhibitor agents.

The method for chemical mechanical polishing of the present invention preferably comprises: providing a substrate, wherein the substrate comprises tungsten (preferably wherein the substrate is a semiconductor wafers comprising tungsten vias); providing a chemical mechanical polishing slurry composition comprising (consisting essentially of), as initial components: water; 0.1 to 5 wt % (preferably 1.5 to 3.5 wt %) of the abrasive (preferably, wherein the abrasive is a colloidal silica abrasive having an average particle size of 10 to 100 nm (preferably 25 to 50 nm)); 0.005 to 0.1 wt % (preferably 0.01 to 0.1 wt %; more preferably 0.01 to 0.03 wt %) of a diquaternary compound according to formula (I):

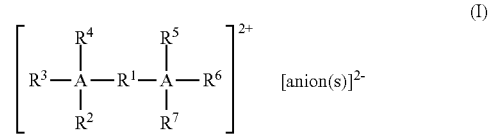

$$\left[ \begin{array}{c} R^4 \quad\quad R^5 \\ | \quad\quad\quad | \\ R^3 - A - R^1 - A - R^6 \\ | \quad\quad\quad | \\ R^2 \quad\quad R^7 \end{array} \right]^{2+} [anion(s)]^{2-} \quad\quad (I)$$

wherein each A is independently selected from N and P (preferably, wherein each A is a N); wherein $R^1$ is selected from a saturated or unsaturated $C_1$-$C_{15}$ alkyl group, a $C_6$-$C_{15}$ aryl group and a $C_6$-$C_{15}$ aralkyl group (preferably, $R^1$ is a —$(CH_2)_4$— group); wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group (preferably, wherein $R^2$, $R^3$, $R^4$, $R^5$, $R^6$ and $R^7$ are each a —$(CH_2)_3CH_3$ group); and, wherein the anion in formula (I) can be any anion or combination of anions that balance the 2+ charge on the cation in formula (I); 0.001 to 10 wt % (preferably 0.01 to 1 wt %, more preferably 0.05 to 0.5 wt %) of at least one of a phthalic acid, a phthalic anhydride, a phthalate compound and a phthalic acid derivative (preferably ammonium hydrogen phthalate); and, 0.001 to 10 wt % (preferably 0.01 to 1 wt %; more preferably 0.1 to 0.5 wt %) potassium iodate; wherein the chemical mechanical polishing composition provided has a pH of 1 to 4 (preferably 2 to 3); wherein the chemical mechanical polishing composition exhibits a tungsten static etch rate of ≤5 Å/min (as measured under the conditions set forth in the Examples) and a tungsten removal rate of ≥100 Å/min (preferably ≥300 Å/min) (as measured under the polishing conditions set forth in the Examples); wherein the chemical mechanical polishing composition contains <0.001 wt % per-oxy oxidizer; and, wherein the chemical mechanical polishing composition contains <0.005 wt % corrosion inhibitor agent; providing a chemical mechanical polishing pad with a polishing surface; creating dynamic contact at an interface between the polishing surface of the chemical mechanical polishing pad and the substrate with a down force of 0.69 to 34.5 kPa; and dispensing the chemical mechanical polishing slurry composition onto the chemical mechanical polishing pad at or near the interface between the chemical mechanical polishing pad and the substrate; wherein the substrate is polished; and, wherein some of the tungsten is removed from the substrate. Preferably, wherein the substrate further comprises TEOS, wherein at least some of the TEOS is removed from the substrate, wherein the chemical mechanical polishing composition exhibits a tungsten removal rate to TEOS removal rate selectivity (as measured under the polishing conditions set forth in the Examples) of 5:1 to 1:5. Preferably, the substrate further comprises $Si_3N_4$, wherein at least some of the $Si_3N_4$ is removed from the substrate, wherein the chemical mechanical polishing composition exhibits a tungsten removal rate to $Si_3N_4$ removal rate selectivity (as measured under the polishing conditions set forth in the Examples) of 2:1 to 1:2.

The method for chemical mechanical polishing of the present invention preferably comprises: providing a substrate, wherein the substrate comprises tungsten (preferably wherein the substrate is a semiconductor wafers comprising tungsten vias); providing a chemical mechanical polishing slurry composition comprising (consisting essentially of), as initial components: water; 1.5 to 3.5 wt % of the abrasive, wherein the abrasive is a colloidal silica abrasive having an average particle size of 25 to 75 nm; 0.01 to 0.03 wt % of the diquaternary compound according to formula (I); wherein each A is a N; wherein $R^1$ is a —$(CH_2)_4$— group; wherein $R^2$, $R^3$, $R^4$, $R^5$, $R^6$ and $R^7$ are each a —$(CH_2)_3CH_3$ group; 0.05 to 0.5 wt % of ammonium hydrogen phthalate; and, 0.1 to 0.5 wt % potassium iodate; wherein the chemical mechanical polishing composition provided has a pH of 2 to 3; wherein the chemical mechanical polishing composition exhibits a tungsten static etch rate of ≤5 Å/min (as measured under the conditions set forth in the Examples) and a tungsten removal rate of ≥100 Å/min (preferably ≥300 Å/min) (as measured under the polishing conditions set forth in the Examples); wherein the chemical mechanical polishing composition contains <0.001 wt % per-oxy oxidizer; and, wherein the chemical mechanical polishing composition contains <0.005 wt % corrosion inhibitor agent; providing a chemical mechanical polishing pad with a polishing surface; creating dynamic contact at an interface between the polishing surface of the chemical mechanical polishing pad and the substrate with a down force of 0.69 to 34.5 kPa; and dispensing the chemical mechanical polishing slurry composition onto the chemical mechanical polishing pad at or near the interface between the chemical mechanical polishing pad and the substrate; wherein the substrate is polished; and, wherein some of the tungsten is removed from the substrate. Preferably, wherein the substrate further comprises TEOS, wherein at least some of the TEOS is removed from the substrate, wherein the chemical mechanical polishing composition exhibits a tungsten removal rate to TEOS removal rate selectivity (as measured under the polishing conditions set forth in the Examples) of 5:1 to 1:5. Preferably, the substrate further comprises $Si_3N_4$, wherein at least some of the $Si_3N_4$ is removed from the substrate, wherein the chemical mechanical polishing composition exhibits a tungsten removal rate to $Si_3N_4$ removal rate selectivity (as measured under the polishing conditions set forth in the Examples) of 2:1 to 1:2.

Some embodiments of the present invention will now be described in detail in the following Examples.

EXAMPLES

Chemical Mechanical Polishing Compositions

The chemical mechanical polishing compositions (CMPC's) tested are described in Table 1. The chemical mechanical polishing compositions A-F are comparative formulations, which are not within the scope of the claimed invention.

TABLE 1

| CMPC | Abrasive A[†] | Abrasive B[x] | Diquat[ε] | AHP | $KIO_3$ | $H_2O_2$ | Glycine | pH |
|---|---|---|---|---|---|---|---|---|
| A | 2.4 | 0.6 | — | 0.16 | 0.1 | — | — | 2.7 |
| B | 2.4 | 0.6 | 0.02 | — | 0.1 | — | — | 2.7 |
| C | 2.4 | 0.6 | — | — | 0.1 | — | 0.0033 | 2.7 |
| D | 2.4 | 0.6 | — | — | 0.1 | — | — | 2.7 |
| E | 2.4 | — | 0.015 | 0.2 | 0.05 | 2 | — | 2.3 |
| F | 2.4 | 0.6 | 0.03 | 0.3 | 0.05 | 2 | — | 2.3 |
| 1 | 2 | 0.4 | 0.015 | 0.3 | 0.5 | — | — | 2.3 |
| 2 | 2 | 0.4 | 0.015 | 0.3 | 1 | — | — | 2.3 |
| 3 | 2 | 0.4 | 0.015 | 0.3 | 2 | — | — | 2.3 |
| 4 | 2.4 | 0.6 | 0.03 | 0.3 | 1 | — | — | 2.3 |
| 5 | 2.4 | 0.6 | 0.02 | 0.16 | 0.1 | — | — | 2.3 |
| 6 | 2.4 | 0.6 | 0.02 | 0.24 | 0.2 | — | — | 2.3 |
| 7 | 2.4 | 0.6 | 0.02 | 0.08 | 0.2 | — | — | 2.7 |
| 8 | 2.4 | 0.6 | 0.02 | 0.08 | 0.3 | — | — | 2.5 |

TABLE 1-continued

| CMPC | Abrasive A† | Abrasive B× | Diquat‡ | AHP | KIO$_3$ | H$_2$O$_2$ | Glycine | pH |
|---|---|---|---|---|---|---|---|---|
| 9  | 2.4 | 0.6 | 0.02 | 0.16 | 0.1 | — | — | 2.7 |
| 10 | 2.4 | 0.6 | 0.02 | 0.16 | 0.2 | — | — | 2.5 |
| 11 | 2.4 | 0.6 | 0.02 | 0.08 | 0.1 | — | — | 2.5 |
| 12 | 2.4 | 0.6 | 0.02 | 0.16 | 0.3 | — | — | 2.7 |
| 13 | 2.4 | 0.6 | 0.02 | 0.24 | 0.1 | — | — | 2.5 |
| 14 | 2.4 | 0.6 | 0.02 | 0.24 | 0.2 | — | — | 2.7 |
| 15 | 2.4 | 0.6 | 0.02 | 0.16 | 0.3 | — | — | 2.3 |
| 16 | 2.4 | 0.6 | 0.02 | 0.24 | 0.3 | — | — | 2.5 |
| 17 | 2.4 | 0.6 | 0.02 | 0.08 | 0.2 | — | — | 2.3 |
| 18 | 2.8 | 0.8 | 0.02 | 0.16 | 0.2 | — | — | 2.5 |
| 19 | 2.4 | 0.6 | 0.02 | 0.16 | 0.1 | — | — | 2.7 |

†Klebosol ™ PL1598-B25 colloidal silica having an average particle size of 25 nm manufactured by AZ Electronic Materials and commercially available from Rohm and Haas Electronic Materials CMP Inc.
×Klebosol ® II 1501-50 colloidal silica having an average particle size of 50 nm manufactured by AZ Electronic Materials and commercially available from Rohm and Haas Electronic Materials CMP Inc.
‡HBBAH: N,N,N,N',N',N'-hexabutyl-1,4-butanediammonium dihydroxide from Sachem, Inc." and structure is as below:

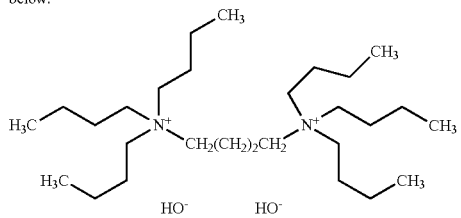

Static Etching Tests

Tungsten blanket wafers were separately immersed for 30 minutes in a conventional hydrogen peroxide containing bulk tungsten slurry (Comparative CMPC G), a CMPC according to Example 5 and a CMPC according to Example 7. The static etching rates observed are reported in Table 2.

TABLE 2

| CMPC | Total W removal (in Å) | Static Etching Rate (in Å/min) |
|---|---|---|
| G | 920 | 31 |
| 5 | 60  | 2 |
| 7 | 40  | 1.5 |

Polishing Tests

Polishing experiments were performed on tetraethylorthosilicate (TEOS), silicon nitride (Si$_3$N$_4$) and tungsten (W) blanket wafers available from SVTC, Advantiv and SKW Associates Inc., respectively, using the chemical mechanical polishing compositions described in Table 1. The polishing experiments were performed using an Applied Materials, Inc. Mirra® 200 mm polishing machine equipped with an ISRM detector system using an IC1010™ polyurethane polishing pad (commercially available from Rohm and Haas Electronic Materials CMP Inc.) under a 2 psi (13.8 kPa) down force, a chemical mechanical polishing composition flow rate of 200 ml/min, a platen speed of 133 rpm and a carrier speed of 111 rpm. A Diagrid® AD3BG-150855 diamond pad conditioner (commercially available from Kinik Company) was used to condition the polishing pad. The polishing pad was broken in with the conditioner using a down force of 7.0 lbs (3.18 kg) for 20 minutes. The polishing pad was further conditioned ex situ prior to polishing using a down force of 5.2 lbs (2.36 kg). The W removal rate data reported in Table 3 was determined using a Jordan Valley JVX-5200T metrology tool. The Si$_3$N$_4$ and TEOS removal rates reported in Table 3 were determined by measuring the film thickness before and after polishing using a KLA-Tencor FX200 metrology tool. The results of the polishing tests are presented in Table 3.

TABLE 3

| CMPC | TEOS RR (Å/min) | W RR (Å/min) | Si$_3$N$_4$ RR (Å/min) | T:W Selec. | W:T Selec. | T:S Selec. | S:T Selec. | W:S Selec. | S:W Selec. |
|---|---|---|---|---|---|---|---|---|---|
| A | 240 | 110 | 1070 | 2.18 | 0.46 | 0.22 | 4.46 | 0.10 | 9.73 |
| B | 650 | 130 | 100  | 5.00 | 0.20 | 6.50 | 0.15 | 1.30 | 0.77 |
| C | 160 | 90  | 1090 | 1.78 | 0.56 | 0.15 | 6.81 | 0.08 | 12.11 |
| D | 160 | 80  | 1070 | 2.00 | 0.50 | 0.15 | 6.69 | 0.07 | 13.38 |
| E | 246 | 592 | —    | 0.42 | 2.41 | —    | —    | —    | —    |
| F | 334 | 453 | —    | 0.74 | 1.36 | —    | —    | —    | —    |
| 1 | 214 | 477 | —    | 0.45 | 2.23 | —    | —    | —    | —    |
| 2 | 187 | 611 | —    | 0.31 | 3.27 | —    | —    | —    | —    |
| 3 | 159 | 672 | —    | 0.24 | 4.23 | —    | —    | —    | —    |
| 4 | 224 | 563 | —    | 0.40 | 2.51 | —    | —    | —    | —    |
| 5 | 421 | 459 | —    | 0.92 | 1.09 | —    | —    | —    | —    |
| 6 | 338 | 544 | —    | 0.62 | 1.61 | —    | —    | —    | —    |
| 7 | 396 | 471 | —    | 0.84 | 1.19 | —    | —    | —    | —    |

TABLE 3-continued

| CMPC | TEOS RR (Å/min) | W RR (Å/min) | Si$_3$N$_4$ RR (Å/min) | T:W Selec. | W:T Selec. | T:S Selec. | S:T Selec. | W:S Selec. | S:W Selec. |
|---|---|---|---|---|---|---|---|---|---|
| 8 | 360 | 522 | — | 0.69 | 1.45 | — | — | — | — |
| 9 | 374 | 375 | — | 1.00 | 1.00 | — | — | — | — |
| 10 | 307 | 433 | — | 0.71 | 1.41 | — | — | — | — |
| 11 | 366 | 315 | — | 1.16 | 0.86 | — | — | — | — |
| 12 | 251 | 458 | — | 0.55 | 1.82 | — | — | — | — |
| 13 | 244 | 339 | — | 0.72 | 1.39 | — | — | — | — |
| 14 | 193 | 411 | — | 0.47 | 2.13 | — | — | — | — |
| 15 | 224 | 430 | — | 0.52 | 1.92 | — | — | — | — |
| 16 | 187 | 418 | — | 0.45 | 2.24 | — | — | — | — |
| 17 | 232 | 336 | — | 0.69 | 1.45 | — | — | — | — |
| 18 | 266 | 377 | — | 0.71 | 1.42 | — | — | — | — |
| 19 | 460 | 120 | 80 | 3.83 | 0.26 | 5.75 | 0.17 | 1.50 | 0.67 |

We claim:

1. A method for chemical mechanical polishing of a substrate, comprising:

providing a substrate, wherein the substrate comprises tungsten;

providing a chemical mechanical polishing slurry composition comprising, as initial components:
water;
0.1 to 5 wt % of an abrasive;
0.005 to 0.1 wt % of a diquaternary compound according to formula (I):

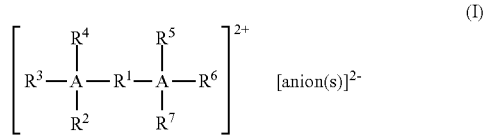

wherein each A is independently selected from N and P; wherein R$^1$ is selected from a saturated or unsaturated C$_1$-C$_{15}$ alkyl group, a C$_6$-C$_{15}$ aryl group and a C$_6$-C$_{15}$ aralkyl group; wherein R$^2$, R$^3$, R$^4$, R$^5$, R$^6$ and R$^7$ are each independently selected from selected from a hydrogen, a saturated or unsaturated C$_1$-C$_{15}$ alkyl group, a C$_6$-C$_{15}$ aryl group, a C$_6$-C$_{15}$ aralkyl group and a C$_6$-C$_{15}$ alkaryl group;

and, wherein the anion in formula (I) can be any anion or combination of anions that balance the 2+ charge on the cation in formula (I);

0.001 to 10 wt % of at least one of a phthalic acid, a phthalic anhydride, a phthalate compound and a phthalic acid derivative;

0.001 to 10 wt % potassium iodate; and, optionally, an acid, wherein the acid is selected from the group consisting of nitric acid, sulfuric acid and hydrochloric acid;

wherein the chemical mechanical polishing composition provided has a pH of 1 to 4; wherein the chemical mechanical polishing composition exhibits a tungsten static etch rate of ≤5 Å/min and a tungsten removal rate of ≥100 Å/min;

wherein the chemical mechanical polishing composition contains <0.001 wt % per-oxy oxidizer; and, wherein the chemical mechanical polishing composition does not contain corrosion inhibitor agent;

providing a chemical mechanical polishing pad with a polishing surface;

creating dynamic contact at an interface between the polishing surface of the chemical mechanical polishing pad and the substrate with a down force of 0.69 to 34.5 kPa; and dispensing the chemical mechanical polishing slurry composition onto the chemical mechanical polishing pad at or near the interface between the chemical mechanical polishing pad and the substrate;

wherein the substrate is polished; and, wherein some of the tungsten is removed from the substrate.

2. The method of claim 1, wherein the chemical mechanical polishing composition exhibits a tungsten removal rate of ≥300 Å/min.

3. The method of 1, wherein the substrate further comprises tetraethylorthosilicate; wherein at least some of the tetraethylorthosilicate is removed from the substrate; and, wherein the chemical mechanical polishing composition exhibits a tungsten removal rate to tetraethylorthosilicate removal rate selectivity of 5:1 to 1:5.

4. The method of claim 1, wherein the substrate further comprises Si$_3$N$_4$; wherein at least some of the Si$_3$N$_4$ is removed from the substrate; and, wherein the chemical mechanical polishing composition exhibits a tungsten removal rate to Si$_3$N$_4$ removal rate selectivity of 2:1 to 1:2.

5. A method for chemical mechanical polishing of a substrate, comprising:

providing a substrate, wherein the substrate comprises tungsten;

providing a chemical mechanical polishing slurry composition, consisting of, as initial components:
water;
1.5 to 3.5 wt % of abrasive, wherein the abrasive is a colloidal silica abrasive having an average particle size of 10 to 100 nm;
0.01 to 0.1 wt % of a diquaternary compound according to formula (I):

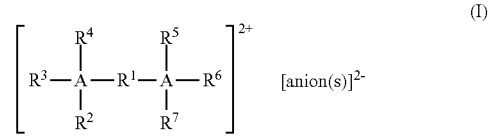

wherein each A is a N; wherein each A is a N; whrein R$^1$ is a —(CH$_2$)$_4$— group;
wherein R$^2$, R$^3$, R$^4$, R$^5$, R$^6$ and R$^7$ are each a —(CH$_2$)$_3$CH$_3$ group; an wherein the anion in formula (I) can be any anion or conbination of anions that balanc the 2+ charge on the cation in formula (I);

0.01 to 1 wt % of ammonium hydrogen phthalate;

0.01 to 1 wt % potassium iodate; and, optionally, an acid, wherein the acid is selected from the group consisting of nitric acid sulfuric acid and hydrochloric acid;

wherein the chemical mechanical polishing composition provided has a pH of 2 to 3; wherein the chemical mechanical polishing composition exhibits a tungsten static etch rate of less than or equal to 5 Å/min and a tungsten removal rate of greater than or equal to 100 Å/min; and, wherein the chemical mechanical polishing composition contains <0.001 wt % per-oxy oxidizer;

providing a chemical mechanical polishing pad with a polishing surface;

creating dynamic contact at an interface between the polishing surface of the chemical mechanical polishing pad and the substrate with a down force of 0.69 to 34.5 kPa; and dispensing the chemical mechanical polishing slurry composition onto the chemical mechanical polishing pad at or near the interface between the chemical mechanical polishing pad and the substrate;

wherein the substrate is polished; and, wherein some of the tungsten is removed from the substrate.

6. The method of claim 5, wherein the chemical mechanical polishing composition facilitates a titanium removal rate of ≥300 Å/min with a platen speed of 133 revolutions per minute, a carrier speed of 111 revolutions per minute, a chemical mechanical polishing composition flow rate of 200 ml/min, and a nominal down force of 13.8 kPa on a 200 mm polishing machine using a chemical mechanical polishing pad that comprises a polyurethane impregnated nonwoven polishing pad.

7. The method of claim 6, wherein the substrate further comprises tetraethylorthosilicate; wherein at least some of the tetraethylorthosilicate is removed from the substrate; and, wherein the chemical mechanical polishing composition exhibits a tungsten removal rate to tetraethylorthosilicate removal rate selectivity of 5:1 to 1:5 with a platen speed of 133 revolutions per minute, a carrier speed of 111 revolutions per minute, a chemical mechanical polishing composition flow rate of 200 ml/min, and a nominal down force of 13.8 kPa on a 200 mm polishing machine using a chemical mechanical polishing pad that comprises a polyurethane impregnated nonwoven polishing pad.

8. The method of claim 6, wherein the substrate further comprises $Si_3N_4$; wherein at least some of the $Si_3N_4$ is removed from the substrate; and, wherein the chemical mechanical polishing composition exhibits a tungsten removal rate to $Si_3N_4$ removal rate selectivity of 2:1 to 1:2 with a platen speed of 133 revolutions per minute, a carrier speed of 111 revolutions per minute, a chemical mechanical polishing composition flow rate of 200 ml/min, and a nominal down force of 13.8 kPa on a 200 mm polishing machine using a chemical mechanical polishing pad that comprises a polyurethane impregnated nonwoven polishing pad.

9. The method of claim 5, wherein the chemical mechanical polishing slurry composition provided, consists of, as initial components:

water;

1.5 to 3.5 wt % of the abrasive, wherein the abrasive is a colloidal silica abrasive having an average particle size of 25 to 75 nm;

0.01 to 0.03 wt % of the diquaternary compound according to formula (I); wherein each A is a N; wherein $R^1$ is a —$(CH)_4$— group; wherein $R^2$, $R^3$, $R^4$, $R^5$, $R^6$ and $R^7$ are each a —$(CH_2)_3CH_3$ group;

0.05 to 0.5 wt % of ammonium hydrogen phthalate; and, 0.1 to 0.5 wt % potassium iodate;

optionally, an acid, wherein the acid is selected from the group consisting of nitric acid, sulfuric acid a hydrochloric acid.

10. The method of claim 9, wherein the chemical mechanical polishing composition facilitates a tungsten removal rate of ≥300 Å/min with a platen speed of 133 revolutions per minute, a carrier speed of 111 revolutions per minute, a chemical mechanical polishing composition flow rate of 200 ml/min, and a nominal down force of 13.8 kPa on a 200 mm polishing machine using a chemical mechanical polishing pad that comprises a polyurethane impregnated nonwoven polishing pad; and wherein the substrate further comprises $Si_3N_4$; wherein at least some of the $Si_3N_4$ is removed from the substrate; and, wherein the chemical mechanical polishing composition exhibits a tungsten removal rate to $Si_3N_4$ removal rate selectivity of 2:1 to 1:2 with a platen speed of 133 revolutions per minute, a carrier speed of 111 revolutions per minute, a chemical mechanical polishing composition flow rate of 200 ml/min, and a nominal down force of 13.8 kPa on a 200 mm polishing machine using a chemical mechanical polishing pd that comprises a polyurethane impregnated nonwoven polishing ad.

11. The method of claim 9, wherein the chemical mechanical polishing composition exhibits a tungsten removal rate of ≥300 Å/min.

12. The method of claim 9, wherein the substrate further comprises tetraethylorthosilicate; wherein at least some of the tetraethylorthosilicate is removed from the substrate; and, wherein the chemical mechanical polishing composition exhibits a tungsten removal rate to tetraethylorthosilicate removal rate selectivity of 5:1 to 1:5.

13. The method of claim 9, wherein the substrate further comprises $Si_3N_4$; wherein at least some of the $Si_3N_4$ is removed from the substrate; and, wherein the chemical mechanical polishing composition exhibits a tungsten removal rate to $Si_3N_4$ removal rate selectivity of 2:1 to 1:2.

14. The method of claim 9, wherein the chemical mechanical polishing composition facilitates a titanium removal rate of ≥300 Å/min with a platen speed of 133 revolutions per minute, a carrier speed of 111 revolutions per minute, a chemical mechanical polishing composition flow rate of 200 ml/min, and a nominal down force of 13.8 kPa on a 200 mm polishing machine using a chemical mechanical polishing pad that comprises a polyurethane impregnated nonwoven polish pad.

15. The method of claim 14, wherein the substrate further comprises tetraethylorthosilicate; wherein at least some of the tetraethylorthosilicate is removed from the substrate; and, wherein the chemical mechanical polishing composition exhibits a tungsten removal rate to tetraethylorthosilicate removal rate selectivity of 5:1 to 1:5 with a platen speed of 133 revolutions per minute, a carrier speed of 111 revolutions per minute, a chemical mechanical polishing composition flow rate of 200 ml/min, and a nominal down force of 13.8 kPa on a 200 mm polishing machine using a chemical mechanical polishing pad that comprises a polyurethane impregnated nonwoven polishing pad.

16. The method of claim 14, wherein the substrate further comprises $Si_3N_4$; wherein at least some of the $Si_3N_4$ is removed from the substrate; and, wherein the chemical mechanical polishing composition exhibits a tungsten removal rate to $Si_3N_4$ removal rate selectivity of 2:1 to 1:2 with a platen speed of 133 revolutions per minute, a carrier speed of 111 revolutions per minute, a chemical mechanical polishing composition flow rate of 200 ml/min, and a nominal down force of 13.8 kPa on a 200 mm polishing machine using a chemical mechanical polishing pad that comprises a polyurethane impregnated nonwoven polishing pad.

* * * * *